United States Patent
Medan et al.

(10) Patent No.: US 9,769,262 B2
(45) Date of Patent: Sep. 19, 2017

(54) DIGITAL SENSOR FOR A CAN NETWORK OF A VEHICLE

(71) Applicant: Masternaut Holdings Limited, Buckinghamshire (GB)

(72) Inventors: Eric Medan, Suresnes (FR); Jean-Yves Berenger, Suresnes (FR)

(73) Assignee: Masternaut Holdings Limited, Buckinghamshire (GB)

( * ) Notice: Subject to any disclaimer, the term of this patent is extended or adjusted under 35 U.S.C. 154(b) by 0 days.

(21) Appl. No.: 14/904,114

(22) PCT Filed: Jul. 8, 2014

(86) PCT No.: PCT/EP2014/064603
§ 371 (c)(1),
(2) Date: Jan. 11, 2016

(87) PCT Pub. No.: WO2015/004132
PCT Pub. Date: Jan. 15, 2015

(65) Prior Publication Data
US 2016/0134705 A1      May 12, 2016

(30) Foreign Application Priority Data

Jul. 12, 2013 (GB) .................................. 1312612.3

(51) Int. Cl.
*G01R 27/26* (2006.01)
*H04L 29/08* (2006.01)
(Continued)

(52) U.S. Cl.
CPC ............ *H04L 67/12* (2013.01); *B60R 16/023* (2013.01); *B60R 16/0238* (2013.01);
(Continued)

(58) Field of Classification Search
CPC ......... H04L 67/12; H04L 27/10; H04L 27/02; H04L 5/06; H04L 5/1423;
(Continued)

(56) References Cited

U.S. PATENT DOCUMENTS 8,548,099 B2   10/2013   Berenger et al.
8,976,015 B2   3/2015    Rieth et al.
(Continued)

OTHER PUBLICATIONS

Abstract of German Patent—DE10343844, Apr. 28, 2005, 2 pages.
(Continued)

*Primary Examiner* — Thang Le
(74) *Attorney, Agent, or Firm* — Dority & Manning, P.A.

(57) ABSTRACT

Digital sensor for a CAN network of a vehicle, comprising a casing which comprises a first portion provided with a housing capable of receiving a first electrical cable and a second electrical cable, said first portion receiving a first electrical component and a second electrical component respectively arranged opposite said housing, and which first electrical component and second electrical component each have a substantially flat surface adapted to constitute a capacitive element with respectively a portion of said first electrical cable and a portion of said second electrical cable, such that, when said first electrical cable and said second electrical cable are received in said housing and each carry a respective CAN digital signal, said first electrical component and said second electrical component carry an electrical signal corresponding to the digital CAN signal respectively carried on said first electrical cable and on said second electrical cable, and a second portion receiving an electronic circuitry connected to said first electrical component and said second electrical component, and arranged on the one hand to process the electrical signals which they carry in order to rebuild a first analog signal and a second analog signal which reflect the digital CAN signal respectively carried by the first electrical cable and the second electrical
(Continued)

cable, and on the other hand to transform the first analog signal and the second analog signal into respective digital CAN signals towards an output connected to said electronic circuitry.

10 Claims, 5 Drawing Sheets

(51) Int. Cl.
    *G01D 11/24*     (2006.01)
    *G01R 15/16*     (2006.01)
    *B60R 16/023*     (2006.01)
    *G01R 31/00*     (2006.01)
    *H04L 12/40*     (2006.01)

(52) U.S. Cl.
    CPC ........... *G01D 11/245* (2013.01); *G01R 15/16* (2013.01); *G01R 27/2605* (2013.01); *G01R 31/007* (2013.01); *H04L 2012/40215* (2013.01); *H04L 2012/40273* (2013.01)

(58) Field of Classification Search
    CPC . H04L 2012/40215; H04L 2012/40273; H04L 2012/40189; H04B 3/548; G01R 27/2605; G01R 15/16; G01R 31/007; B60R 16/0238; B60R 16/023
    See application file for complete search history.

(56) References Cited

U.S. PATENT DOCUMENTS

| | | | |
|---|---|---|---|
| 2004/0229495 A1* | 11/2004 | Negishi | H01R 4/2433 439/402 |
| 2007/0189323 A1 | 8/2007 | Swoboda et al. | |
| 2008/0103653 A1* | 5/2008 | Raichle | G07C 5/0808 701/33.3 |
| 2009/0292841 A1* | 11/2009 | Weser | H04L 12/40013 710/106 |
| 2011/0199229 A1* | 8/2011 | Rieth | G01D 21/00 340/901 |
| 2013/0342008 A1* | 12/2013 | Takata | H04B 3/548 307/9.1 |
| 2015/0321627 A1* | 11/2015 | Nobauer | H04B 3/548 307/10.1 |

OTHER PUBLICATIONS

Operation Manual for Contactless reader CANCrocodile, Ver. 1.0 from Technoton, 11 pages.
International Search Report for PCT/EP2014/064603, dated Nov. 4, 2014, 3 pages.

* cited by examiner

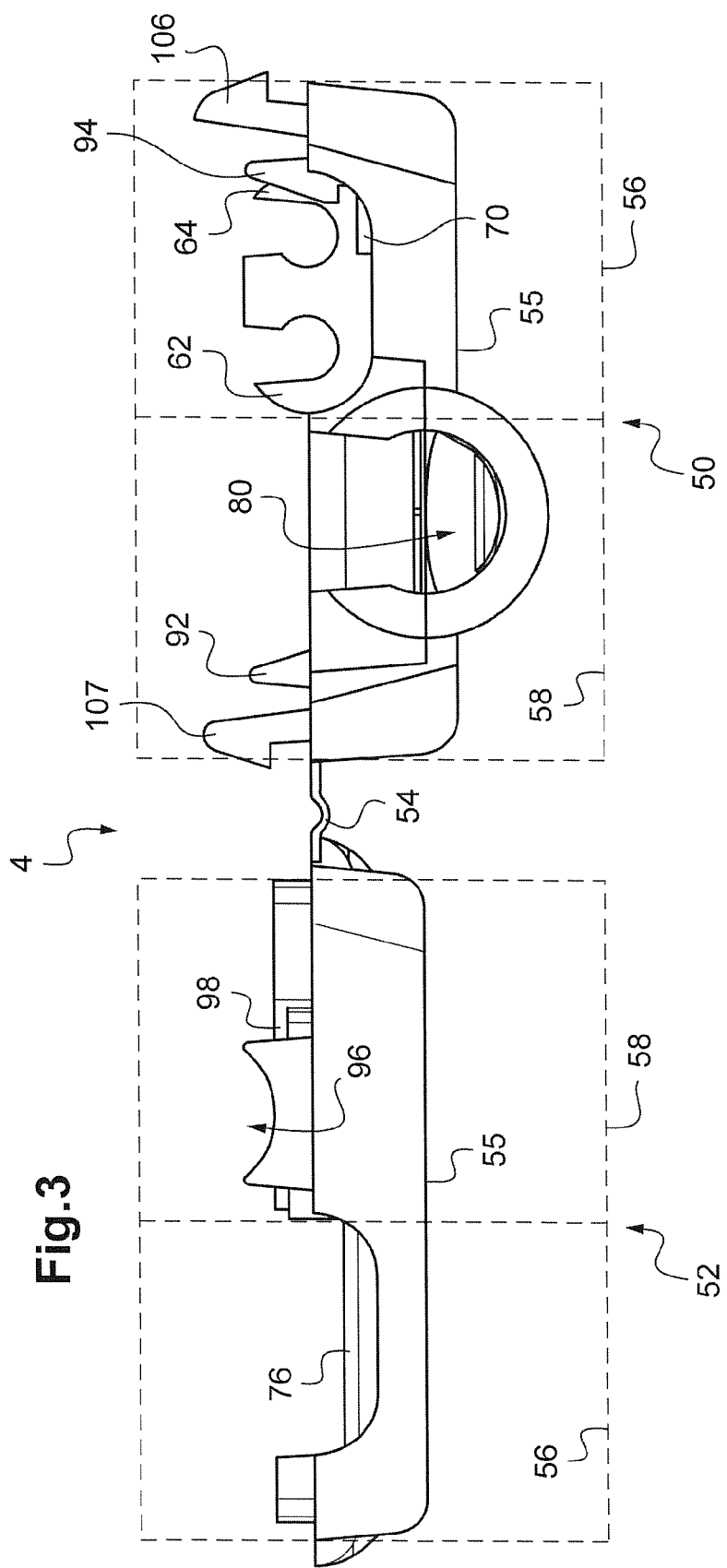

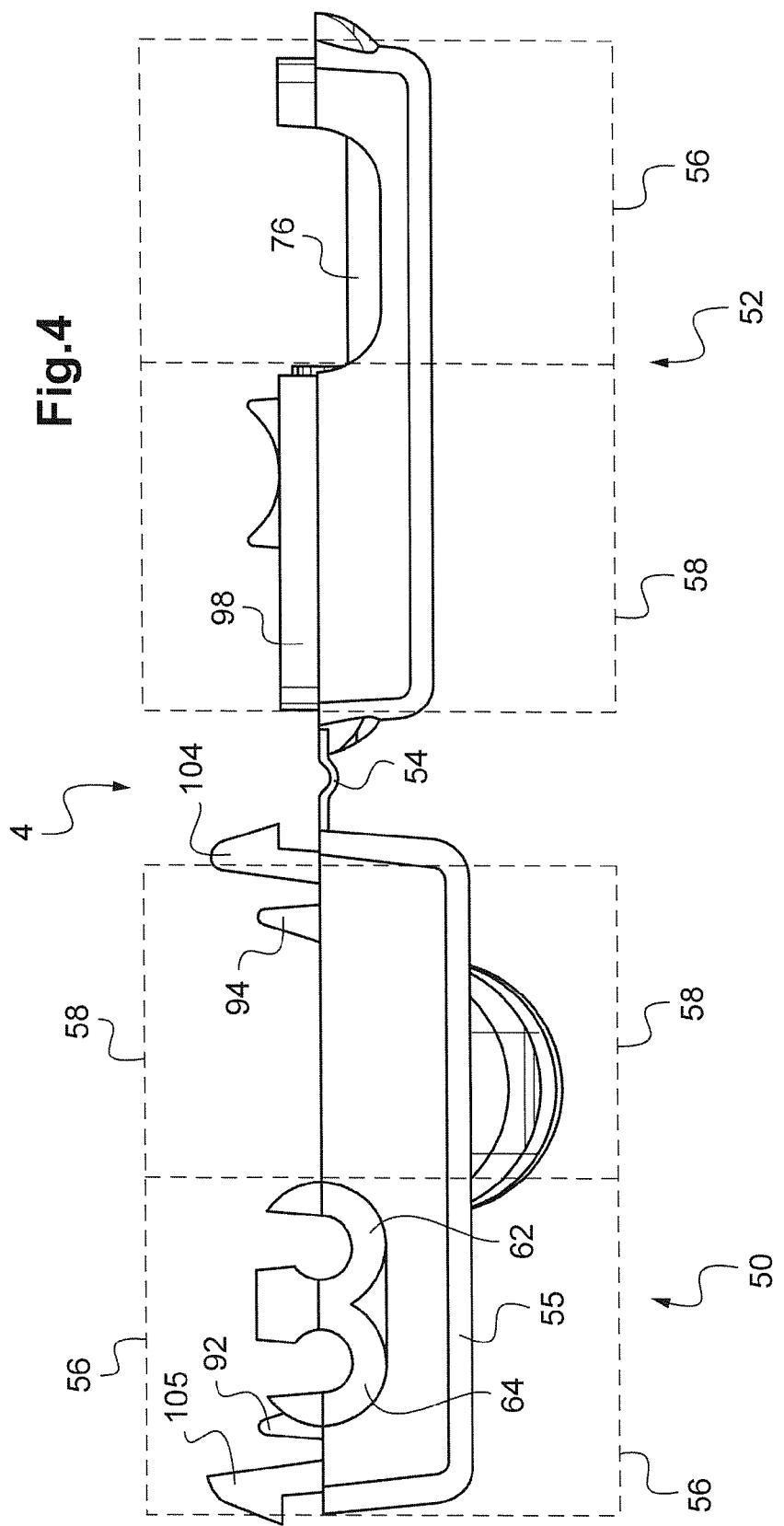

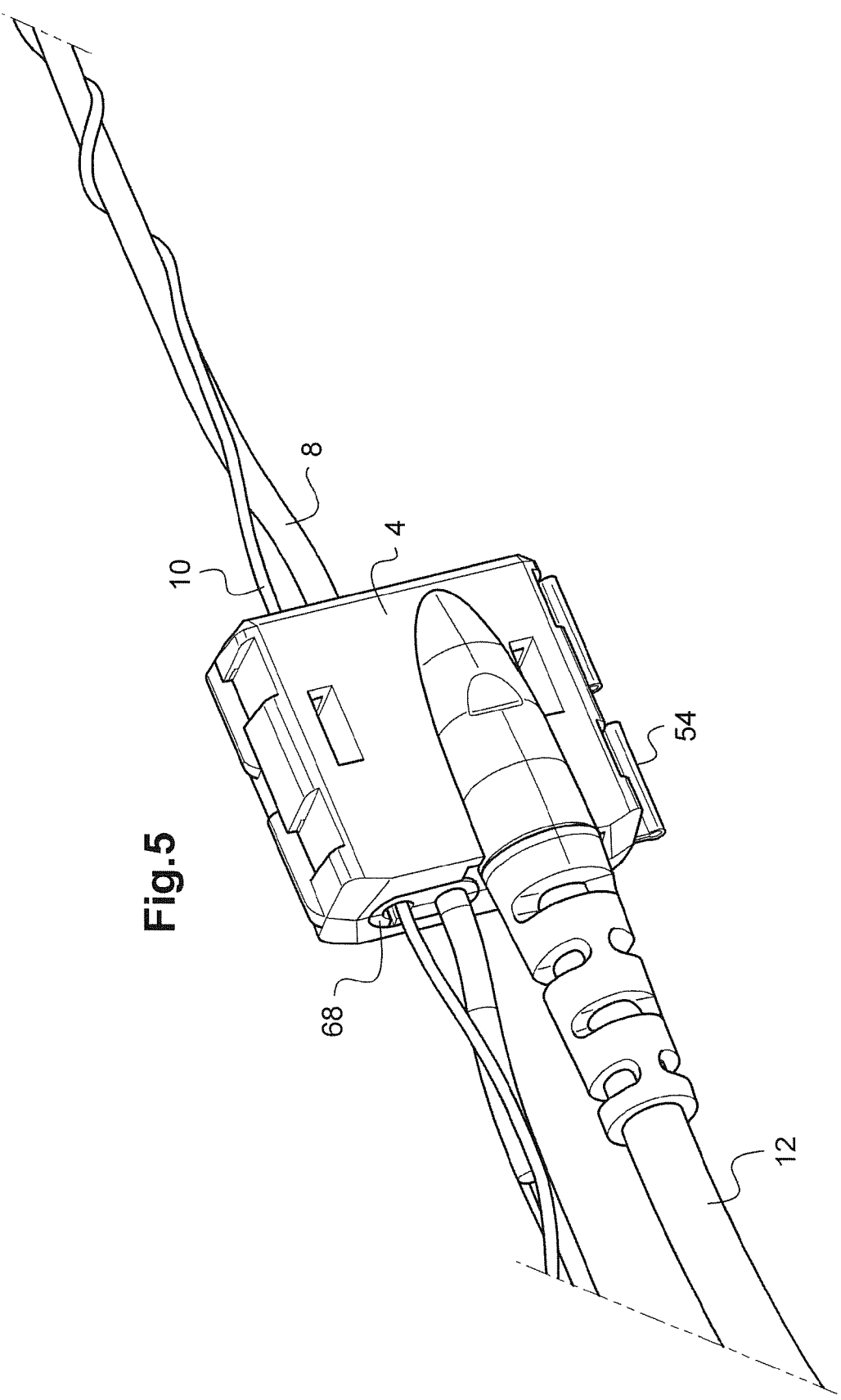

DIGITAL SENSOR FOR A CAN NETWORK OF A VEHICLE

CROSS REFERENCE TO RELATED APPLICATION

This application is the national stage entry of International Patent Application No. PCT/EP2014/064603 having a filing date of Jul. 8, 2014, which claims priority to and the benefit of Great Britain Patent No. 1312612.3 filed in the Great Britain Intellectual Property Office on Jul. 12, 2013, the entire contents of which are incorporated herein by reference.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC OR AS A TEST FILE VIA THE OFFICE ELECTRONIC FILING SYSTEM (EFS-WEB)

Not applicable.

STATEMENT REGARDING PRIOR DISCLOSURES BY THE INVENTOR AS A JOINT INVENTOR

Not applicable.

BACKGROUND OF THE INVENTION

The invention concerns the field of CAN (Controller Area Network) sensing devices.

The invention concerns the field of CAN sensing devices.

CAN networks are widely used in the vehicle industry, from airplanes to trains and automotive vehicles. There is a common need to monitor the activity on the CAN network of a given vehicle. For warranty and reliability reasons, third parties have designed wireless CAN network sensors.

A classical CAN network sensor comprises a clamp-like portion, which is designed to put each of the pair of CAN cables in vicinity with a respective electric component, so as to generate two respective capacities. The analogue signal which is sensed at the respective capacities when the CAN cables are received is driven towards a remote processing unit, which reconstitutes the signal on the CAN cables from the sensed analogue signal.

While seemingly simple on paper, the manufacturing of wireless CAN network sensors poses great challenges. Inductive sensing was first envisioned, due to its easier design. However, it is more sensitive to surrounding noise, and proved to be unfit in real-life vehicle environment, which are extremely noisy.

The use of capacity sensing thus constituted a first major breakthrough in the wireless CAN sensor industrialization. In order to overcome the low energy yield of the capacitive technology, the first wireless CAN sensors were designed to offer the biggest capacitive matching surface available for the CAN cables. Since sensors surrounding the cables were hard to manufacture and use, long and flat sensors were used, in order to improve the sensed amplitude.

The resulting sensors are bulky and unpractical to use. Indeed, the CAN cables in vehicles are usually located in somewhat remote locations, and are tightly twisted together and with other cables, forming complex vehicle harnesses. Since the sensors show great lengths in order to maximize the amplitude of the sensed signal, it is necessary to untwist long portions of twisted CAN cables, resulting in slow operation and damages to the vehicle CAN cables, as well as the other cables in the vehicle harness.

BRIEF SUMMARY OF THE INVENTION

The invention aims at improving the situation, with a digital sensor for a CAN network of a vehicle, comprising a casing which comprises a first portion provided with a housing capable of receiving a first electrical cable and a second electrical cable, said first portion receiving a first electrical component and a second electrical component respectively arranged opposite said housing, and which first electrical component and second electrical component each have a substantially flat surface adapted to constitute a capacitive element with respectively a portion of said first electrical cable and a portion of said second electrical cable, such that, when said first electrical cable and said second electrical cable are received in said housing and each carry a respective CAN digital signal, said first electrical component and said second electrical component carry an electrical signal corresponding to the digital CAN signal respectively carried on said first electrical cable and on said second electrical cable.

The casing further comprises a second portion receiving an electronic circuitry connected to said first electrical component and said second electrical component, and arranged on the one hand to process the electrical signals which they carry in order to rebuild a first analogue signal and a second analogue signal which reflect the digital CAN signal respectively carried by the first electrical cable and the second electrical cable, and on the other hand to transform the first analogue signal and the second analogue signal into respective digital CAN signals towards an output connected to said electronic circuitry.

Instead of maximizing the amplitude of the sensed analogue signal, which requires bigger sensors, the applicant's invention reduces the sensor's length and overall size, and uses the gained space to include a processing unit within the sensor in order to directly output digital CAN signals.

Contrary to all that has been done before, and to what the man skilled in the art would do to improve upon the existing devices, the applicant has discovered that this simplifies the use of the sensor, and that the use of the gained space to include the processing unit allows to provide an all-in-one sensor, without the need for any additional electronics, and pluggable in existing CAN monitoring systems. The fact that the processing unit was brought closer to the analogue sensor improved signal-to-noise ratio over existing sensors, since the connection between classical sensors and their remote processing unit is located in a noisy environment. This allowed reducing the length of the sensor, thus improving its usability.

According to further aspects, a CAN sensor for a vehicle may further comprise the following features:

said housing is arranged such that said first electrical cable and said second electrical cable are spaced apart by a distance comprised between 1 mm and 10 mm, and preferably between 1.5 mm and 5 mm when they are received, said first portion comprises cables clamps for securing said portions of said first electrical cable and said second electrical cable, said output comprises a sheath having a clamping portion for securing said portions of said first electrical cable and said second electrical cable, the first portion has a substantially rectangular shape in cross section, the longest side of which extends along a direction substantially parallel to a receiving direction for the first electrical cable and the second electrical cable in said housing, and in which the second portion has a general shape and dimensions similar to those of said first portion, said first portion further comprises at least one foam biasing member for biasing said first electrical cable and said second electrical cable respectively towards said first electrical component and said second electrical component, said first portion and said second portion comprise arms for supporting said electronic circuitry, the first portion further comprises arms for securing the electronic circuitry, said second portion comprises an inner raised wall, said casing comprises a first casing portion and a second casing portion connected by a hinge, each of said first portion and said second portion being defined at least in part by said first casing portion and by said second casing portion.

BRIEF DESCRIPTION OF THE SEVERAL VIEW OF THE DRAWINGS

Other features and advantages of the invention will appear more readily from the following description, which is taken from illustrative and non-limiting examples based on the drawings on which:

FIG. 3 shows a side view of FIG. 2 as defined by arrow III;

FIG. 4 shows another side view of FIG. 2 as defined by arrow IV; and

FIG. 5 represents an isometric view of the sensor of FIG. 1 in a closed position, with corresponding CAN and output cables.

The drawings and the following description comprise, for the main part, elements which positively define the embodiments. As a result, they may be used both for the purpose of improving the understanding of the invention, but also for the purpose of defining it, if the need arises.

Figure 1:
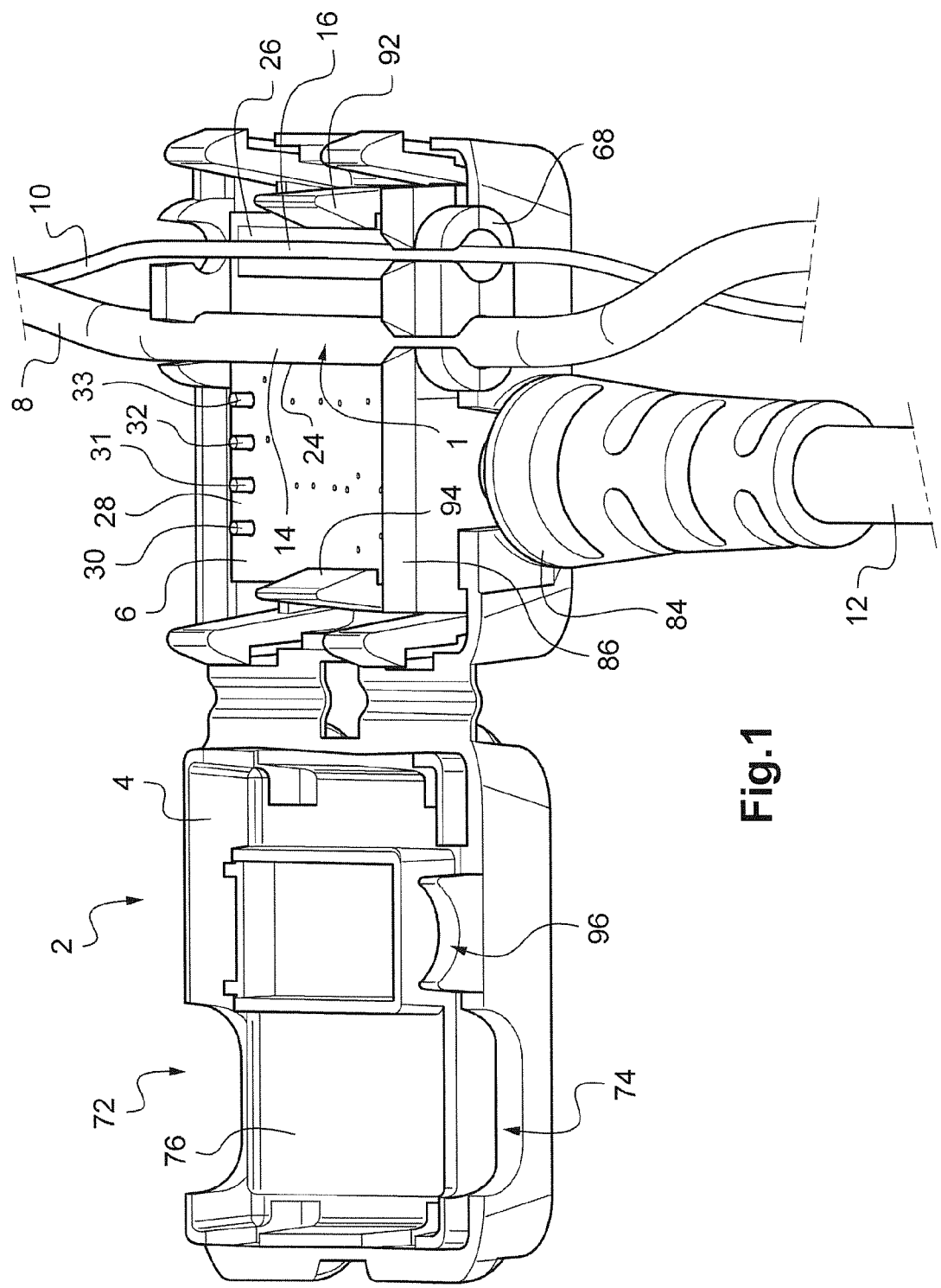
FIG. 1 shows an isometric view of a sensor according to an embodiment of the invention in an open position, with corresponding CAN and output cables.

FIG. 1 represents a schematic isometric view of a CAN sensor 2 according to the invention, in an open position. The CAN sensor 2 is particularly suited for automotive vehicles. As appears on this drawing, the CAN sensor 2 comprises a casing 4, which receives an electronic circuitry 6, two CAN cables respectively 8 and 10, as well as an output cable 12.

As always the case in automotive vehicles, and more generally in all vehicles, the CAN cables 8 and 10 are respectively called "CAN HIGH" and "CAN LOW", and are strongly twisted. In order to be housed in the casing 4, the cables 8 and 10 are untwisted along portions respectively referenced 14 and 16.

The cable portion 14 and 16 are received in a first portion of the casing 4, and the electronic circuitry 6 and the output cable 12 are received in a second portion of the casing 4. First portion and second portion of the casing 4 will be described in more detail with respect to FIGS. 2 to 4.

Opposite cable portion 14 and 16, the first portion 18 of the casing 4 comprises a first electrical component 24 and a second electrical component 26. The first electrical component 24 is arranged substantially parallel and opposite cable portion 14, whereas the second electrical component 26 is arranged substantially parallel and opposite cable portion 16. The first electrical component 24 and the second electrical component 26 are substantially flat, meaning that their surface is much greater than their depth. Those components have a strip-like shape, adapted to correspond to an untwisted portion of an electrical cable.

First electrical component 24 and second electrical component 26 are arranged in the first portion 18 of the casing 4 such that they are in close vicinity with respectively cable portion 14 and cable portion 16, thereby forming respective capacitive elements. This close arrangement is further obtained by means of a foam biasing member not shown on FIG. 1, which biases the first electrical cable 8 and the second electrical cable 10 towards the first electrical component 24 and the second electrical component 26 when the casing 4 is closed. As a result, when the first electrical cable 8 and the second electrical cable 10 carry respective CAN digital signals, the first electrical component 24 and the second electrical component 26 carry corresponding electrical signals by capacitive sensing effect.

The first electrical component 24 and the second electrical component 26 are electrically connected to the electronic circuitry 6. In the example herein described, the electronic circuitry 6 comprises electronic elements (not visible on FIG. 1) which are received on a printed circuit-board PCB 28. PCB 28 extends from the second portion 20 of the casing 4 to the first portion 18 of the casing 4, where it receives the first electrical component 24 and the second electrical component 26.

The electronic elements of the electronic circuitry 6 are arranged to process the electrical signals which are carried by the first electrical component 24 and the second electrical component 26. The processing of these signals comprises two steps:

analogue synthesis, in order to recover a first analogue signal corresponding to the CAN digital signal carried on the first electrical cable 8, and a second analogue signal corresponding to the CAN digital signal carried on the second electrical cable 10, and digital synthesis, in order to provide CAN digital signals based on the first analogue signal and the second analogue signal.

The two CAN digital signals outputted by the electronic circuitry 6 are then transmitted towards the output cable 12, which is connected to the electronic circuitry 6 via four pins referenced 30 to 33.

It should be noted that including the electronic circuitry 6 in the sensing portion is totally novel in the domain of digital sensors for CAN networks of a vehicle.

In existing systems, there was a sensing portion and a processing portion. The sensing portion only received the CAN cables, and comprised basic circuitry for amplifying the signal sensed by capacitive sensing. The output of the sensing portion was analogue, and all further processing was done remotely from the sensing part by the processing portion.

The rationale was that, since the space available for the sensing portion is limited within the vehicle, and that capacitive sensing has a low yield, the sensing portion should be designed towards maximizing the sensed signal, and all further processing should be performed remotely. The above reasoning was reinforced by the fact that the environment of vehicles, and in particular automotive vehicles, is extremely noisy electronically speaking. As a result, it was considered that it was necessary to maximize sensed signal amplitude in order to improve signal-to-noise ratio. The resulting sensors were extremely bulky, and required to untwist long lengths of twisted CAN cables. The existing trend in the field was to include more powerful amplification stages within the sensing portion, in order to improve the signal-to-noise ratio.

The Applicant has further discovered that, instead of including more powerful analogue amplification stages and process remotely, it is preferable to directly output a CAN digital signal, without remote processing.

By contrast with the existing sensing devices, the sensor according to the invention is fully embedded, meaning that the processing portion is included in the sensor itself, and that the output cable can be directly plugged in an analysis system for monitoring the CAN network of the vehicle.

Figure 2:
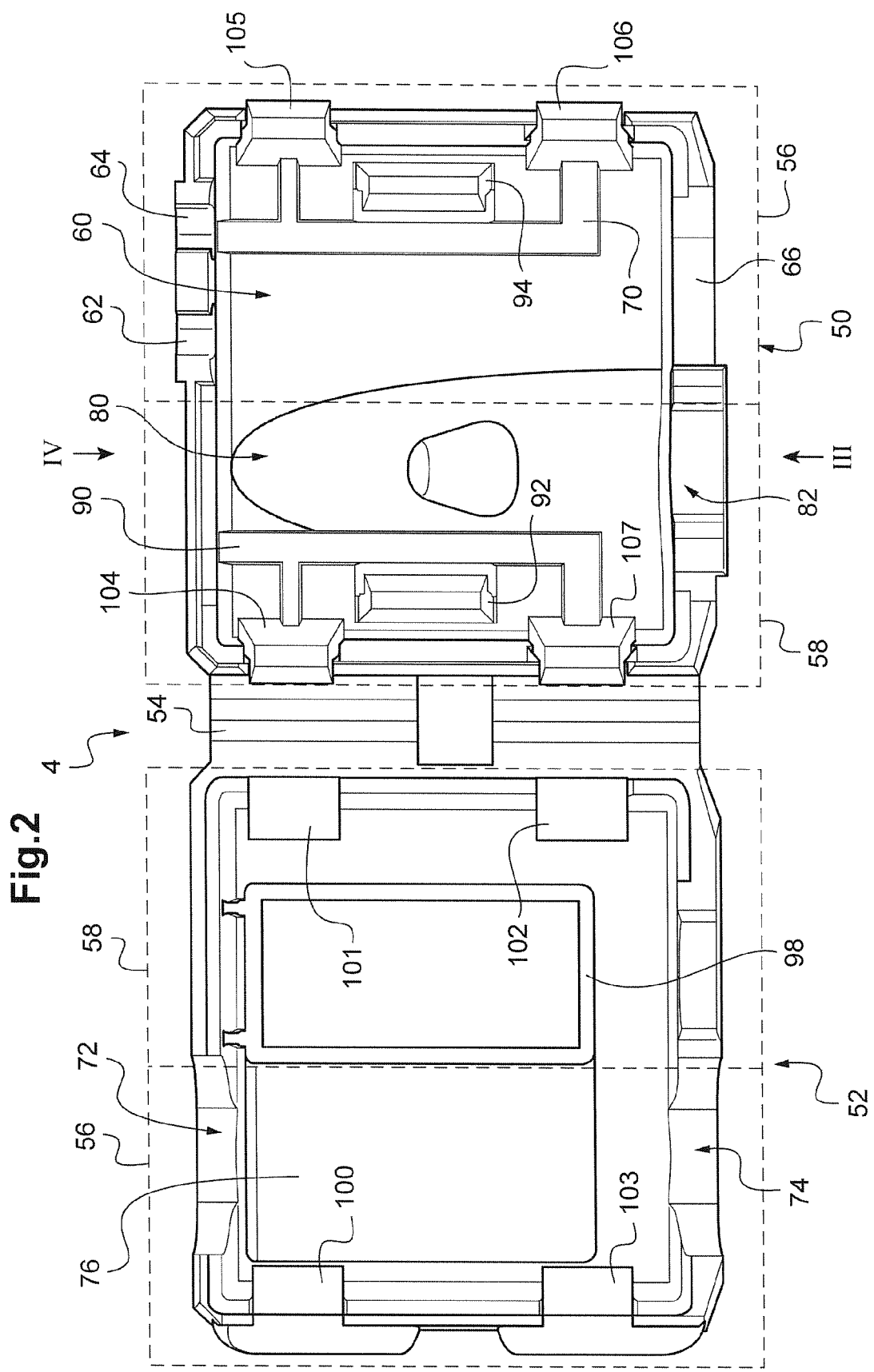
FIG. 2 shows a schematic top view of the casing of FIG. 1.

The reasoning of the Applicant is very different from what existed in prior solutions, and resulted in further improvements that will appear more clearly with the description of FIGS. 2 to 4.

FIG. 2 is a face view of casing 4 shown of FIG. 1. FIG. 3 is a right-side view of casing 4 (arrow III), and FIG. 4 is a left-side view of casing 4 (arrow IV). None of the other elements shown on FIG. 1 appear on FIGS. 2 to 4.

As appears on the drawing, the casing 4 comprises a first casing part 50 and a second casing part 52 connected by a hinge 54. First casing part 50 and second casing part 52 can be assembled to close the casing 4, as shown on FIG. 5. The first casing part 50 and second casing part 52 have a substantially square bottom having a raised peripheral wall which define together half-shells both referenced 55. In alternative embodiments, they could be substantially rectangular. Functionally speaking, the first casing part 50 is designed as a receiving part, whereas the second casing part 52 is designed as a cover-like part. This means that the first casing part 50 comprises various housings to receive the elements from FIG. 1 not shown on FIG. 2, whereas second casing part 52 is designed to allow proper closing and stability in the closed position of the casing 4.

The first casing part 50 and the second casing part 52 each comprise a first portion 56 and a second portion 58.

The first portion 56 and the second portion 58 are substantially rectangular and have substantially identical dimensions. In alternative embodiments, they can be substantially square and have different sizes. The first portion 56 corresponds to the part of casing 4 which receives the cable portions 14 and 16, as well as the electrical components 26 and 28. The second portion 58 corresponds to the part of the casing 4 which receives the electronic circuitry 6 and the output cable 12.

The first portion 56 is thus designed to receive the capacitive sensing part of the sensor 2, whereas the second portion 58 is designed to receive the signal processing part of the sensor 2. This design is very practical, because the arrangement of the first portion 56 and the second portion 58 alongside limits the overall length of the casing 4, thus reducing the length of cables 8 and 10 to untwist to its bare minimum. Furthermore, the first portion 56 and the second portion 58 are designed to have the smallest width possible, thus facilitating the use of sensor 2 in the cramped spaces of modern vehicle harnesses. Generally speaking the first portion 56 and the second portion 58 have a bigger length than width, their length being substantially equal to the length of cable portions 14 and 16.

The first portion 56 of first casing part 50 comprises a housing 60 for receiving cable portion 14 and 16. In the left-most part of FIG. 2, housing 60 comprises two cable clamps referenced 62 and 64. Cable clamp 62 is arranged to receive cable 8, whereas cable clamp 64 is arranged to receive cable 10. On the right-most portion of FIG. 2, housing 60 is defined as a recess 66 arranged to receive a clamping portion 68. In this embodiment, clamping portion 68 is formed integral with the output cable 12 (see FIG. 5). In an alternative embodiment, the recess 66 and the clamping portion 68 can be replaced by cable clamps similar to cable clamps 62 and 64. The bottom of first portion 56 of first casing part 50 also receives an arm 70 which will be described in more detail further below.

The first portion 56 of second casing part 52 is designed to match the shape of first casing part 50 when the casing 4 is closed. Accordingly, its peripheral wall comprises two recesses 72 and 74, which substantially match the shapes of cable clamps 62 and 64 on the one hand, and cable clamp 68 on the other hand. As a result, and as apparent on FIG. 5, when casing 4 is closed, only portions of cables 8 and 10 entering first portion 56 can be seen. First portion 56 of second casing part 52 comprises a bottom portion 76 adapted to receive foam biasing members. According to various embodiments, there can be a unique foam biasing member or two separate members separated by a wall and secured by any appropriate means. Bottom portion 76 may also comprise lateral walls for positioning purposes of the biasing means.

Cable clamps 62 and 64 and clamping portion 68 are arranged such that such that said electrical cable 8 and second electrical cable 10 are spaced apart by a distance of 2 mm, advantageously comprised between 1 mm and 10 mm, and preferably between 1.5 mm and 5 mm when they are received. This arrangement is very advantageous because it guarantees that there is no crosstalk in the sensed signals, while reducing as much as possible the width of the sensing portion. Furthermore, this allows to reduce the length of first electrical component 24 and second electrical component 26 to about 18 mm, thus limiting the length of cable to be untwisted to about 32 mm, as opposed to about 42 mm for existing solutions.

The second portion 58 of first casing part 50 comprises a housing 80 which is bullet-shaped for accommodating the end of output cable 12. More specifically, output cable 12 comprises a sheath which encases four separate cables.

The peripheral wall of first casing part 50 comprises recess 82 for accommodating output cable 12. In the example described herein, the sheath of output cable 12 has a first portion 84 which has a diameter wider than that of recess 82, a second portion which substantially has the same diameter as recess 82, and a third portion 86 which has again a diameter wider than that of recess 82. In this manner, when the output cable 12 is received in the housing 80 through recess 82, it is securely held.

The portion of output cable 12 which lies within first casing part 50 beyond the third portion 86 is unsheathed, and the four cables lie within housing 80 and are separated and respectively connected to pins 30 to 33. As described above, in the embodiment herein described, the sheath of output cable 12 extends laterally to comprise clamping portion 68 received in recess 66. This allows the sheath to abut opposite peripheral walls of first casing part 50, thus improving the securing of the output cable 12.

In the left-most part of the second portion 58 of first casing part 50 on FIG. 2, an arm 90 is arranged on the bottom of first casing part 50. Arm 90 collaborates with arm 70 to provide two functions. The first function of arms 70 and 90 is to provide a support for the PCB of electronic circuitry 6. The PCB of electronic circuitry 6 is limited on the other side by two teeth referenced 92 and 94. The second function of arms 70 and 90 is to strengthen first casing part 50. Optionally, the first casing part 50 may be provided with a further arm similar to arms 70 and 90, which is located substantially in the middle of the first casing part 50, thereby further strengthening the first casing part 50 and visually separating first portion 56 and second portion 58 of first casing part 50.

The second portion 58 of second casing part 52 comprises a recess 96 which is complementary with the shape of output cable 12 when it is received in recess 82, such that when casing 4 is closed, only the sheath of output cable 12 entering second portion 58 can be seen.

The second portion 58 of second casing part 52 also comprises an inner raised wall 98, which defines a housing for the pins 30 to 33 and the other components on the PCB when casing 4 is closed. Inner raised wall 98 also strengthens the second casing part 52, in the same way as arms 70 and 90 of first casing part 50.

Finally, the second casing part 52 comprises four through-holes 100 to 103, and the first casing part 50 comprises four corresponding teeth 104 to 107 for securing the casing 4 when it is in closed position.

The dimensioning efforts performed by the applicant have allowed reducing all of the dimensions of the sensing portion of the sensor. This size reduction allows for a more usable sensor, which is easier to operate. It also facilitates the embedding of the processing portion in the same casing as the sensing portion, which further allows reducing the length of the sensing portion, since the lower sensed signals may be processed as they suffer less from the noisy environment. As a result, the sensor of the invention may be commoditized, since it is fully embedded.

These results are extremely interesting because they allow a new use for the digital sensor according to the invention. Classically, digital sensors for a CAN network of a vehicle are installed only during specific monitoring procedures. After the monitoring procedure, they are not left in place because they are too big for prolonged installation in the vehicle harness, and because they necessitate a remote installation to make use of the sensed signals.

By contrast, the smaller and embedded sensor of the invention allows permanent installation of the sensor. There is no need to remove the sensor between two successive monitoring procedures. This makes these procedures both safer and quicker, because the technician only needs to connect to the output of the sensor, without any need for untwisting and clamping (except for the very first installation). In that regard, the teeth 104 to 107 insure that, even if the hinge is broken between two monitoring procedures, the sensor will remain operable. Further, sensor of the invention also allows the installation of a clamping collar, which ensures that the sensor is not tampered with between two successive monitoring procedures.

The invention claimed is:

1. A digital sensor for a CAN (Controller Area Network) network of a vehicle, comprising a casing which comprises a first portion provided with a housing capable of receiving a first electrical cable and a second electrical cable, said first portion receiving a first electrical component and a second electrical component respectively arranged opposite said housing, and which said first electrical component and said second electrical component each have a substantially flat surface adapted to constitute a capacitive element with respectively a portion of said first electrical cable and a portion of said second electrical cable, such that, when said first electrical cable and said second electrical cable are received in said housing and each carry a respective CAN digital signal, said first electrical component and said second electrical component which each carry an electrical signal corresponding to the digital CAN signal respectively carried on said first electrical cable and on said second electrical cable, and a second portion receiving an electronic circuitry connected to said first electrical component and said second electrical component, and arranged on the one hand to process the electrical signals which they carry in order to rebuild a first analogue signal and a second analogue signal which reflect the digital CAN signal respectively carried by the first electrical cable and the second electrical cable, and on the other hand to transform the first analogue signal and the second analogue signal into respective digital CAN signals towards an output connected to said electronic circuitry.

2. The digital sensor according to claim 1, wherein said housing is arranged such that said first electrical cable and said second electrical cable are spaced apart by a distance between 1 mm and 10 mm, and preferably between 1.5 mm and 5 mm, when they are received.

3. The digital sensor according to claim 2, wherein said first portion comprises cables clamps for securing said portions of said first electrical cable and said second electrical cable.

4. The digital sensor according to of claim 2, wherein said output comprises a sheath having a clamping portion for securing said portions of said first electrical cable and said second electrical cable.

5. The digital sensor according to claim 1, wherein the first portion has a substantially rectangular shape in cross section, the longest side of which extends along a direction substantially parallel to a receiving direction for the first electrical cable and the second electrical cable in said housing, and in which the second portion has a shape and dimensions similar to those of said first portion.

6. The digital sensor according to claim 1, where said first portion further comprises at least one foam biasing member for biasing said first electrical cable and said second electrical cable respectively towards said first electrical component and said second electrical component.

7. The digital sensor according to claim 1, wherein said first portion and said second portion comprise arms for supporting said electronic circuitry.

8. The digital sensor according to claim 1, wherein the first portion further comprises arms for securing the electronic circuitry.

9. The digital sensor according to claim 1, where said second portion comprises an inner raised wall.

10. The digital sensor according to claim 1, wherein said casing comprises a first casing portion and a second casing portion connected by a hinge, each of said first portion and said second portion being defined at least in part by said first casing portion and by said second casing portion.

* * * * *